Dec. 9, 1969 W. L. C. HUI ET AL 3,483,038

INTEGRATED ARRAY OF THIN-FILM PHOTOVOLTAIC CELLS
AND METHOD OF MAKING SAME
Filed Jan. 5, 1967

Inventors:
WILLIAM L.C. HUI &
GEORGE R. AUTH
By Arthur I. Speckler
Attorney

United States Patent Office 3,483,038

Patented Dec. 9, 1969

3,483,038

INTEGRATED ARRAY OF THIN-FILM PHOTOVOLTAIC CELLS AND METHOD OF MAKING SAME

William L. C. Hui, Princeton, and George R. Auth, Hightstown, N.J., assignors to RCA Corporation, a corporation of Delaware Filed Jan. 5, 1967, Ser. No. 607,463

Int. Cl. H01g 9/20; H01l 7/14; B32b 3/10

U.S. Cl. 136—89 19 Claims

ABSTRACT OF THE DISCLOSURE

An integrated array of serially connected, thin-film, photovoltaic cells comprises a plurality of similar multi-layered cells integrally formed on, and united to, a flexible substrate of insulating plastic material. Each of the multi-layered cells in the integrated array is fabricated by a novel method wherein similar layers of each of the cells are deposited simultaneously from a common source of material, preferably from the vapor phase. The multi-layered cells are also interconnected simultaneously by electrodes, deposited preferably from the vapor phase.

BACKGROUND OF THE INVENTION

This invention relates generally to arrays of solar cells and methods of making them. More particularly, the invention relates to a novel integrated array of serially connected, thin-film, photovoltaic cells and a novel method of making it. The novel integrated array is particularly useful for converting radiant energy efficiently into electrical energy.

It has been proposed to provide electrical energy for space vehicles, for example, by converting light energy into electrical energy. To this end, tens of thousands of silicon solar cells have been assembled manually with adhesives to suitable metal support structures and interconnected by conectors soldered to each cell to form an array. Such prior-art arrays, however, are relatively expensive, heavy, non-flexible, difficult to construct, and difficult to deploy in a space vehicle.

SUMMARY OF THE INVENTION

Briefly stated, the novel integrated array comprises a plurality of serially connected, thin-film, multi-layered, photovoltaic cells integrally united to a substrate, preferably of flexible, plastic insulating material. Each of the multi-layered cells comprises, in the order named, a bottom electrode, a film of semiconductor material of one type conductivity covering and overlapping all but an exposed portion of the bottom electrode adjacent to an edge thereof, a light-transparent film of semiconductor material of an opposite type conductivity forming a PN junction or a metal film forming a barrier junction with the film of one type conductivity, and a top electrode comprising a thin-film of a metal extending to, and making connection with, the exposed portion of the bottom electrode of an adjacent cell, whereby to connect the adjacent cells in series. In a preferred embodiment, the bottom electrode comprises a three-layered metal film to provide good adhesion and ohmic contact of the cells to the substrate, and the top electrode comprises, in part, a two-layered metal film to prevent the top electrode from shorting the cell and to provide a good ohmic contact to the cell.

The novel integrated arrays are made by a novel method wherein similar layers of the similar multi-layered cells and interconnections for the array are deposited simultaneously from a common material onto a common substrate, preferably from the vapor phase. Thus for each cell in the integrated array, there is deposited, in the order named, a thin-film bottom electrode, a thin-film semiconductor material of one type conductivity, a light-transparent, barrier, thin-film semiconductor material of an opposite type conductivity to form a PN junction or barrier with the semiconductor material of said one type conductivity, and a top electrode comprising a thin-film of metal which is also used for interconnecting adjacent cells.

It is an object of the present invention to provide a novel, large-area, flexible, fully integrated array of series connected, thin-film, solar cells by a novel continuous method.

Another object of the present invention is to provide a novel integrated array that has a greater power density (watts/lb.), an increased reliability, a greater flexibility for easier storage, and a relatively lower cost per watt in comparison to silicon prior-art, solar cell arrays.

DESCRIPTION OF THE PREFERRED EMBODIMENTS

Figure 1:
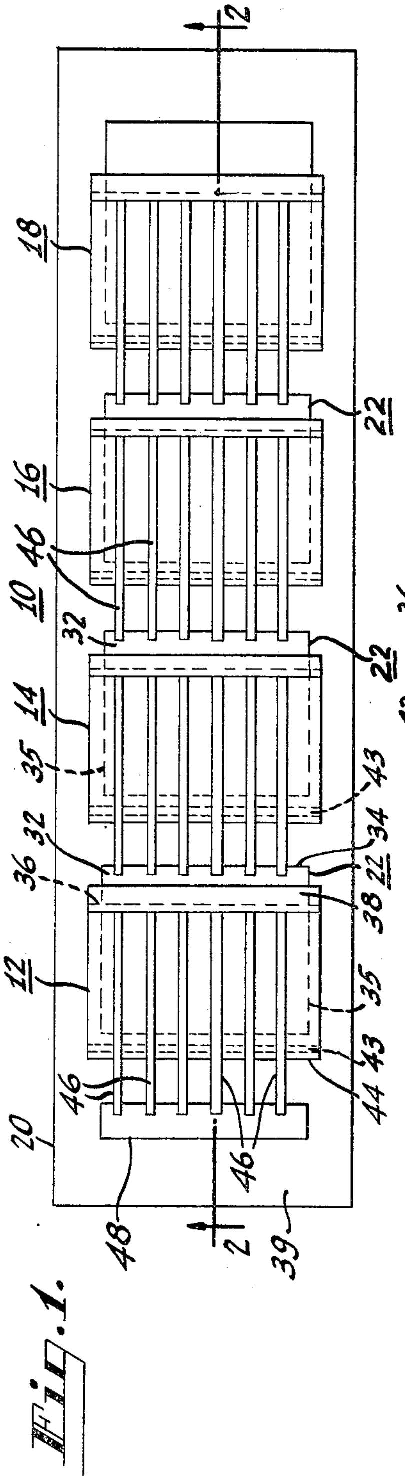
FIG. 1 is a plan view of one embodiment of the novel integrated array with its protective coating removed.
Figure 2:
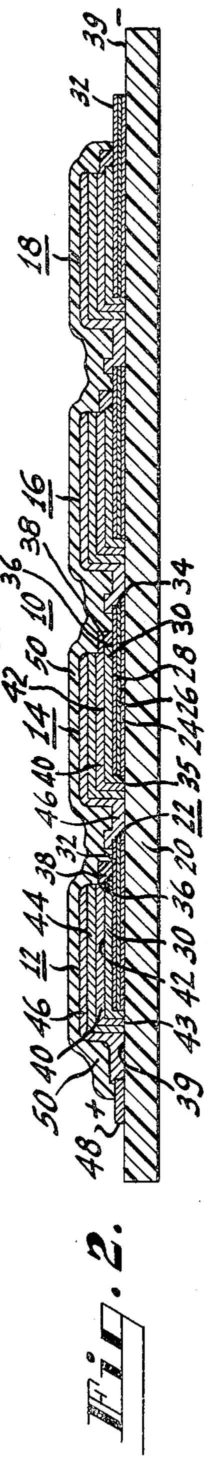
FIG. 2 is a cross-sectional view of the novel integrated array taken along the line 2—2 of FIG. 1, showing, in addition, a protective coating over the integrated array.

Referring to FIGS. 1 and 2 of the drawing, there is shown a novel integrated array 10 of a plurality of serially connected, multi-layered, thin-film, photovoltaic cells 12, 14, 16, and 18 integrally formed on, and united to, a substrate 20 of flexible insulating material. Although the novel integrated array 10 described and illustrated herein has only four cells for the sake of clarity of explanation, the integrated array 10 may have as many cells as are convenient and practical for any particular application. The integrated array 10 is so called because portions of its components, cells 12–18 and their interconnections, are deposited simultaneously from common materials, on the same common planar substrate 20, as will be hereinafter explained.

The substrate 20 is preferably a polyimide plastic material, such as "Kapton," a trademarked product of E. I. du Pont de Nemours and Company. The substrate 20 may have a thickness of between about 0.0005 and 0.002 inch and an area of any desired dimensions, depending upon the size of the processing equipment available or the size and number of the cells to be deposited thereon.

The multi-layered cells 12–18 are integrally formed on, and united to, the substrate 20 by the simultaneous deposition of similar layers or films for each cell. Each of the layers of the multi-layered cells 12–18 are relatively thin films, but their illustrated thicknesses in the drawing are exaggerated for the sake of clarity. The over-all thickness of the novel integrated array 10 is between about 0.001 and 0.004 inch. Since the corresponding thin-film layers in each of the cells 12–18 in the array 10 are similar, the construction of only a typical cell, the cell 14, for example, will be explained in detail. Corresponding layers or films in other cells will be designated by similar reference characters.

The cell 14 comprises a metal bottom electrode 22 which, e.g., may be a film of one metal, such as gold, or a triple layered film of three metals, as shown in FIG. 2. Thus, the bottom electrode 22 consists of a layer 24 of chromium, a layer 26 of indium, and a layer 28 of gold. The bottom electrode 22 of three metal films is preferred to that of one metal film because the former provides better adhesive properties to the substrate 20 and a more reliable ohmic contact to the semiconductor layers of the photovoltaic cells.

It is also within the contemplation of the invention to integrally bond any cadmium sulfide layer to a substrate by means of a triple layer of chromium, indium, and gold, as explained supra.

A semiconductor material of N type conductivity, such as a cadmium sulfide (CdS) film 30, is disposed on the bottom electrode 22. The cadmium sulfide film 30 covers, and completely overlaps, all but a small strip portion 32 of the bottom electrode 22 along an edge 34 thereof. An edge 36 of the cadmium sulfide film 30 and a portion of the strip portion 32 adjacent to the cadmium sulfide film 30 are covered with an electrically insulating material 38, such as silicon dioxide ($SiO_2$) or zinc sulfide (ZnS), to prevent subsequent layers or films on the cadmium sulfide layer 30 from contacting the exposed strip portion 32 of the bottom electrode 22. The remaining edges of the cadmium sulfide film 30 extend to the surface 39 of the substrate 20. This overlapping is also important because the subsequent films to be deposited over the cadmium sulfide film 30 must not come in contact with the bottom electrode 22. This overlapping structure also makes possible to deposit adjacent cells in series by an interconnecting electrode strip, as will be hereinafter explained.

A semiconductor material of P type conductivity, such as a cuprous sulfide (barrier) film 40, is deposited or formed on the cadmium sulfide film 30 to provide a PN junction 42 therewith. An edge 43 of the cuprous sulfide film 40 (of the cell 14), adjacent to the cell 12, also contacts the surface 39 of the substrate 20.

The top electrode of the cell 14 should make a good ohmic contact with the thin, cuprous sulfide film 40, but it should not penetrate the cuprous sulfide film 40 and contact the cadmium sulfide film 30. To this end, the top electrode comprises a thin tellurium film 44 which is disposed over the cuprous sulfide film 40. The tellurium film 44 would also make a rectifying contact with the cadmium sulfide film 30 if it should penetrate the cuprous sulfide film 40. The top electrode also includes, in addition to the tellurium film 44, a plurality of spaced-apart top electrode strips 46 of a metal, such as gold or copper. These strips extend over the tellurium layer 44, over the top surface 39 of the substrate 20, and make an electrical connection with the strip portion 32 of the adjacent cell (which in this instance is cell 12). Thus, the top electrode strips 46 electrically connect the cell 14 in series with the adjacent cell 12.

The integrated array 10 may contain one or more bus bars which may be deposited on the substrate 20 at the same time that the bottom electrodes 22 of the cells are deposited thereon. Thus, a (positive) bus bar 48 of the same material as the bottom electrodes 22 is disposed on the surface 39 of the substrate 20, adjacent to one side of the cell 12, for connecting the top electrode strips 46 thereto. The negative electrode of the integrated array 10 may be the large strip portion 32 of the bottom electrode 22 of the cell 18.

While the embodiment of the integrated array 10 illustrated in FIGS. 1 and 2 shows one row of spaced-apart, linearly aligned cells 12–18 connected in series, the integrated array 10 may also contain a plurality of rows of cells wherein some (or all) of the rows are connected in parallel with each other, as desired, to provide a predetermined power output.

After the cells 12–18 are formed on the substrate 20, they may be covered with a protective, light-transmitting coating or film 50 of a material such as silicone, epoxy, glass, quartz, alumina, or the like.

In operation, the integrated array 10 converts light energy into electrical energy when the cells 12–18 are exposed to light energy. In each cell, light energy transmitted through the tellurium film 44 and the cuprous sulfide film 40 reaches the PN junction 42 where hole and electron pairs are formed to produce a voltage between the bottom electrode 22 and the top electrode strips 46. Since this voltage for a photovoltaic, cadmium sulfide cell is typically about 0.4–0.5 volt, the cells 12–18 are connected in series to provide a desired voltage. The current capacity at the desired voltage may be increased by connecting a plurality of the serially connected rows of cells in parallel.

Figure 4:
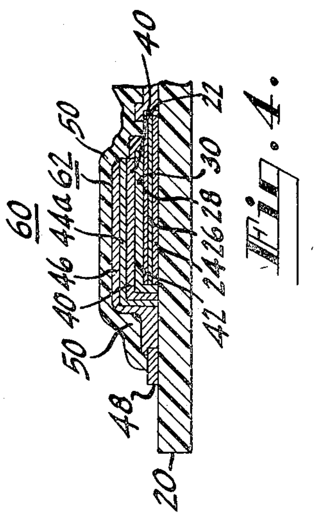
FIG. 4 is a fragmentary, cross-sectional view of the novel integrated array taken along the line 4—4 of FIG. 3.
Figure 3:
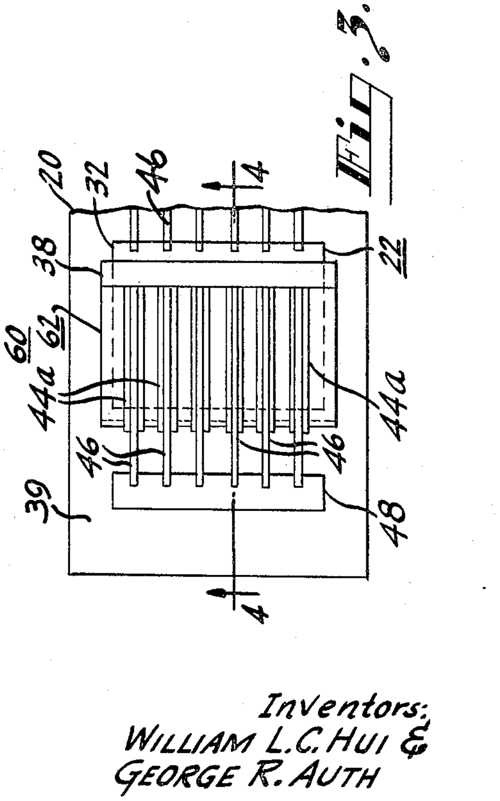
FIG. 3 is a fragmentary, plan view of another embodiment of the novel integrated array with its protective coating removed.

Referring now to FIGS. 3 and 4 of the drawing, there is shown a fragmentary section of an integrated array 60, another embodiment of the invention, comprising a plurality of similar, multi-layered, thin-film, photovoltaic cells, such as the cell 62. The cell 62 differs from the cells 12–18 only in that the tellurium film beneath the top electrode strips 46 is divided into a plurality of spaced-apart tellurium film strips *44a*, one tellurium film strip *44a* for each top electrode strip 46. By providing a plurality of spaced-apart tellurium film strips *44a* instead of a single tellurium film, more light energy may be transmitted to the cuprous sulfide film 40, and the cell 62, therefore, converts light energy into electrical energy more efficiently. Otherwise, the operation of the integrated array 60 is similar to that of the integrated array 10.

The novel integrated arrays 10 and 60 are made in a continuous method wherein similar layers in each of the multi-layered cells are formed simultaneously from a common source of material, preferably by deposition from the vapor phase. First, the polyimide plastic substrate 20 is cleaned and degreased with a detergent and isopropyl alcohol. Then, a plurality of the bottom electrodes 22 and bus bars 48 are deposited on the cleaned surface 39 of the substrate 20 by depositing, e.g., either a single layer of gold thereon or a layer of three superimposed films of chromium, indium, and gold. When the bottom electrode 22 is a single film of gold, the gold is deposited on the substrate 20 from the vapor state in an evacuated atmosphere (vacuum) through an apertured mask in a manner well known in the art. The substrate 20 is maintained at a temperature of 200° C. during the deposition process. The thickness of the bottom electrode 22, when of a single layer of gold, is between about 2,000 A. and 4,000 A.

For better adhesions to the substrate 20 and a lower resistance ohmic contact to the cadmium sulfide layer, it has been found that a bottom electrode 22 of the layers of chromium, indium, and gold is preferred. When the bottom electrode 22 is a triple layer, the chromium film 24 is deposited to a thickness of between about 10 A. and 50 A., the indium film 26 is deposited on the chromium film 24 to a thickness of between about 50 A. and 100 A., and the gold film 28 is deposited on the indium film 26 to a thickness of between about 2,000 A. and 4,000 A. The latter depositions are also from the vapor state through suitably apertured masks. The bus bar 48 and any additional bus bars or electrical contacts on the surface 39 of the substrate 20 may be deposited from the vapor state through a suitably apertured mask at the same time the bottom electrodes 22 for the cells are deposited.

Next, the cadmium sulfide films 30 for each of the cells 12–18 are deposited through a suitably apertured mask from the vapor state to a thickness of between about 12 microns and 25 microns. Each of the cadmium sulfide films 30 covers, and completely overlaps, all but a small strip portion 32 of the bottom electrode 22 adjacent the edge 34 thereof. The strip portion 32 will be used subsequently either for electrical connecting means to the top electrode of an adjacent cell to make a series connection therewith or for an output terminal, negative bus bar, (as in cell 18). It is important that the cadmium sulfide film 30 in each of the cells 12–18, for example, overlaps at least a portion of the periphery of the bottom electrode 22, such as edge 35 thereof, and extends to the surface 39 of the substrate 20 because the subsequent overlapping films and the top electrode in each cell must not contact the bottom electrode 22 thereof.

The surfaces of the cadmium sulfide films 30 may be etched with hydrochloric acid for about 3–5 seconds, if necessary, before the cuprous sulfide (barrier) films 40 are deposited simultaneously from the vapor state through a suitably apertured mask over the cadmium sulfide films 30 for each of the cells. In each of the cells, the edge 36 of the cadmium sulfide film 30, adjacent to the strip portion 32, is first coated with an insulating material, such as silicon dioxide, as by deposition from the vapor state through a suitable mask to prevent the cuprous sulfide film 40 from coming in contact with the strip portion 32 of the bottom electrode 22. This precaution prevents shorting of the PN junction 42 which is formed between the cadmium sulfide film 30 and the cuprous sulfide film 40. After the cuprous sulfide films 40 are formed, they are annealed by heating them to a temperature of about 300° C. in argon. Each of the cuprous sulfide films 40 should have a thickness of between about 100 A. and 1,000 A.

Instead of forming the cuprous sulfide films 40 by deposition from the vapor state through a suitably apertured mask, the cuprous sulfide films 40 may be formed on the cadmium sulfide films 30 by applying a substantially saturated cuprous chloride solution to the cadmium sulfide films 30 until the cuprous sulfide films 40 are formed by a chemical substitution process to a thickness of between about 100 A. or 1,000 A. The cuprous sulfide films 40 so formed are annealed by heating in argon to a temperature of 300° C.

The tellurium films 44 of the integrated array 10 are deposited simultaneously from the vapor state through a suitably apertured mask over the cuprous sulfide films 40. The tellurium films 44 should be relatively thin because they should be transparent to light. A typical thickness of a tellurium film is about 100 A. The tellurium films 44*a* of the integrated array 60 are also deposited over the cuprous sulfide films 40 through a suitably apertured mask. Like the tellurium films 44, the tellurium films 44*a* should have edges that extend to the surface 39 of the substrate 20 for the purpose hereinafter appearing.

The tellurium films 44 and 44*a* are part of the top electrodes of the cells and serve to provide a good ohmic contact between the subsequent metal top electrode strips 46 and the cuprous sulfide films 40. The tellurium films 44 and 44*a* would also function to provide a rectifying contact with the cadmium sulfide films 30 if they should accidentally penetrate the cuprous sulfide films 40, thereby preventing the top electrode strips 46 from shorting to the PN junction 42 through the cuprous sulfide films 40.

A plurality of top electrode strips 46 are deposited simultaneously through a suitably apertured mask from the vapor state over the tellurium films 44 or 44*a*. In the embodiment of the integrated array 60, a top electrode strip 46 is deposited over each of the tellurium films 44*a*. The top electrode strips 46 extend over the upper surface 39 of the substrate 20 and extend partially over the strip portions 32 of the bottom electrodes 22 of adjacent cells to connect the adjacent cells electrically in series. Thus, as shown in FIGS. 1 and 2, for example, the top electrode strips 46 of the cell 18 extend to the strip portion 32 of the bottom electrode 22 of the cell 16, connecting the adjacent cells 16 and 18 in series. Since portions of the edges of the cadmium sulfide film 30, the cuprous sulfide film 40, and the tellurium film 44 in the cell 18 extend to the surface 39 of the substrate 20, adjacent the cell 16, it is possible for the top electrode strip 46 of the cell 18 to be deposited over the tellurium film 44 and the top surface 39 of the substrate 20 in one operation without shorting the cell 18. Thus, integrated techniques are employed for fabricating the novel integrated arrays 10 and 60.

It is also within the contemplation of the present invention to produce a plurality of integrated arrays of cells sequentially on divided portions of the same substrate when the available processing equipment is not large enough to produce all of the cells simultaneously on all of the portions of the substrate.

The connected cells 12–18 of the integrated array 10 may be encapsulated with a suitable protective and/or antireflective coating 50 of a light-transparent material such as Mylar, silicone, and the like. The cells of the integrated array 60 can also be coated with the protective coating 50.

Integrated arrays of multiple cadmium sulfide, photovoltaic cells of the type described have been operated with efficiencies of over 5% and have exhibited a specific power to weight ratio of about 100 watts/lb. Silicone coated cells, such as cells 12–18, have been shown to have at least three orders of magnitude more resistance to low-energy photon damage than conventional, silicon solar cells. Integrated arrays 10 and 60 on a flexible substrate of "Kapton" can be easily stored in rolls, and their cost and weight are significantly lower than prior-art silicon-type photovoltaic arrays.

What is claimed is:

1. A method of making an integrated array of serially connected, thin-film, photovoltaic cells comprising:
   providing a flexible substrate of insulating material,
   coating a major surface of said substrate simultaneously with a plurality of metal bottom electrodes, a separate one of said bottom electrodes being for each of said cells,
   coating each of said bottom electrodes, except for a portion adjacent an edge thereof, simultaneously with a film of semiconductor material of one type conductivity,
   coating each of said films of one type conductivity simultaneously with a relatively thin, transparent film of semiconductor material of an opposite type conductivity,
   coating a metal top electrode simultaneously on each of said films of opposite type conductivity, selected ones of said top electrodes extending to, and making connection with, separate ones of said portions of said bottom electrodes of adjacent cells to connect said cells in series.

2. A method of making an integrated array as described in claim 1, wherein said coating a major surface of said substrate simultaneously with a plurality of metal bottom electrodes comprises:
   depositing simultaneously a plurality of spaced-apart layers of a first metal on said major surface,
   depositing simultaneously a plurality of layers of a second metal over said layers of said first metal, and
   depositing simultaneously a third layer of a third metal over said layers of said second metal.

3. A method of making an integrated array as described in claim 1, wherein said coating a major surface of said substrate simultaneously with a plurality of metal bottom electrodes comprises:
   depositing metal through a suitably apertured mask onto said major surface of said substrate, some of said metal deposited comprising at least one bus bar.

4. A method of making an integrated array of serially connected, thin-film, photovoltaic cells comprising:
   providing a flexible substrate of insulating material,
   depositing a plurality of thin-film, metal bottom electrodes simultaneously on a major surface of said substrate, a separate one of said bottom electrodes being for each of said cells, simultaneously depositing a separate film of cadmium sulfide over all but a portion adjacent an edge of each of said bottom electrodes, simultaneously depositing a separate film of cuprous sulfide on each of said films of cadmium sulfide to form a PN junction therewith, simultaneously depositing a separate film of tellurium on each of said films of cuprous sulfide, and simultaneously depositing a metal, top electrode on each of said films of tellurium, selected ones of said top electrodes of said cells extending to, and making connection with, separate ones of said portions of said bottom electrodes of adjacent cells to connect said cells in series.

5. A method of making an integrated array of serially connected, thin-film, photovoltaic cells as described in claim 4, wherein said flexible substrate comprises a polyimide plastic material, and wherein said depositing of a plurality of bottom electrodes comprises depositing gold from the vapor phase onto said major surface to a thickness of between 2,000 A. and 4,000 A.

6. A method of making an integrated array of serially connected, thin-film, photovoltaic cells as described in claim 4, wherein said depositing a plurality of bottom metal contacts adhesively to a major surface of said substrate comprises:

depositing simultaneously from the vapor phase a plurality of spaced-apart layers of chromium on said major surface, depositing simultaneously from the vapor phase a plurality of layers of indium over said layers, respectively, of chromium, and depositing from the vapor phase a plurality of layers of gold over said layers, respectively, of said indium.

7. A method of making an array of serially connected thin-film photovoltaic cells as described in claim 6, wherein said layers of chromium are deposited to a thickness of between about 10 A. and 50 A., said layers of indium are deposited to a thickness of between about 50 A. and 100 A., and said layers of gold are deposited to a thickness of between about 2,000 A. and 4,000 A .

8. A method of making an array of serially connected thin-film photovoltaic cells as described in claim 4, wherein said films of cadmium sulfide are deposited from the vapor phase to a thickness of between about 12 microns and 25 microns.

9. A method of making an array of serially connected thin-film photovoltaic cells as described in claim 4, wherein said films of cuprous sulfide are deposited from the vapor phase to a thickness of between about 100 A. and 1,000 A., and said films of cuprous sulfide are annealed by heating them to a temperature of about 300° C.

10. A method of making an array of serially connected thin-film photovoltaic cells as described in claim 4, wherein said films of cuprous sulfide are formed by exposing said cadmium sulfide layers to a solution of cuprous chloride until said layers of cuprous sulfide acquire a thickness of between about 100 A. and 1,000 A., and said films of cuprous sulfide are annealed by heating them to a temperature of about 300° C.

11. A method of making an array of serially connected, thin-film, photovoltaic cells as described in claim 4, wherein said films of tellurium are deposited from the vapor phase to a thickness of about 100 A.

12. A method of making an array of serially connected, thin-film, photovoltaic cells as described in claim 4, wherein said depositing of said metal top electrodes comprises depositing from the vapor phase a plurality of spaced-apart gold strips on said films of tellurium in each of said cells.

13. An integrated array of serially connected, thin-film, photovoltaic cells comprising:

a relatively thin flexible substrate of electrically insulating material, a plurality of said cells integrally united to a major surface of said substrate in a spaced-apart relationship, each of said cells comprising:

a metal bottom electrode coated on said substrate, a film of semiconductor material of one type conductivity covering and overlapping all but a portion adjacent an edge of said bototm electrode, a radiant energy transmitting film of semiconductor material of an opposite type conductivity on said film of semiconductor of one type conductivity and forming a PN junction therewith, and a metal top electrode comprising at least one relatively narrow metal strip coated on said semiconductor material of opposite type conductivity, selected ones of said portions of said bottom electrodes being serially connected to selected ones of said metal strips of said top electrodes to connect said cells in series.

14. An integrated array of serially connected thin-film photovoltaic cells as described in claim 13, wherein each of said bottom electrodes comprises a layer of chromium on said major surface of said substrate, a layer of indium on said layer of chromium, and a layer of gold on said layer of indium.

15. An integrated array of serially connected photovoltaic cells as described in claim 13, wherein said films of semiconductor material have edges extending to said major surface, and each of said top electrodes comprises a film of tellurium which has an edge that extends to said major surface of said substrate and a plurality of said spaced-apart metal strips which extend over said film of tellurium, onto said major surface of said substrate, and into contact with selected one of said portions of said bottom electrode.

16. An integrated array of serially connected, thin-film, photovoltaic cells as described in claim 13, wherein said top electrode for each cell comprises a plurality of spaced-apart thin films of tellurium on said radiant energy transmitting film and one of said metal strips on each of said films of tellurium.

17. In a method of making an integrated circuit on a substrate wherein said circuit has a component comprising a cadmium sulfide film in ohmic contact with an electrode, the improvement comprising forming said electrode by the steps of:

depositing a layer of chromium on said substrate, depositing a layer of indium over said layer of chromium and, depositing a layer of indium over said layer of chromium and, depositing a layer of gold over said layer of indium, said film of cadmium sulfide being deposited on said layer of gold.

18. In a method of making an integrated circuit as described in claim 17, wherein said layers of chromium, indium, and gold are deposited from the vapor phase, and wherein said substrate is a polyimide plastic material.

19. A method of making an integrated array of serially connected, thin-film, photovoltaic cells comprising the steps of:

providing a flexible substrate of insulating material, coating a major surface of said substrate with a plurality of metal bottom electrode films, a separate one of said bottom electrode films being for each of said cells, coating each of said bottom electrode films, except for a portion adjacent an edge thereof, with a film of semiconductor material of one type conductivity, coating each of said films of one type conductivity with a relatively thin, transparent film of semiconductor material of an opposite type conductivity, and coating a metal top electrode film on each of said films of opposite type conductivity, selected ones of said top electrode films extending to, and making connection with, separate ones of said portions of said bottom electrode films of adjacent cells to connect said cells in series.

References Cited

UNITED STATES PATENTS

| | | | |
|---|---|---|---|
| 2,962,539 | 11/1960 | Daniel | 136—89 |
| 3,025,335 | 3/1962 | Ralph | 136—89 |

| | | | |
|---|---|---|---|
| 3,040,416 | 6/1962 | Matlow et al. | 29—572 |
| 3,255,047 | 6/1966 | Escoffery | 136—89 |
| 3,382,099 | 5/1968 | Montmory | 117—217 |

WINSTON A. DOUGLAS, Primary Examiner

M. J. ANDREWS, Assistant Examiner

U.S. Cl. X.R.

29—572